United States Patent [19]

Tsang

[11] Patent Number: 5,781,133
[45] Date of Patent: Jul. 14, 1998

[54] METHOD AND APPARATUS FOR IMPLEMENTING RUN LENGTH LIMITED CODES

[75] Inventor: Kinhing Paul Tsang, Plymouth, Minn.

[73] Assignee: Seagate Technology, Inc., Scotts Valley, Calif.

[21] Appl. No.: 792,194

[22] Filed: Jan. 30, 1997

Related U.S. Application Data

[60] Provisional application No. 60/023,225 Aug. 5, 1996.
[51] Int. Cl.$^6$ .................................................. H03M 7/46
[52] U.S. Cl. .................................................. 341/59
[58] Field of Search ........................... 341/59, 81, 60, 341/82, 51

[56] References Cited

U.S. PATENT DOCUMENTS

| | | | |
|---|---|---|---|
| 4,566,105 | 1/1986 | Oisel et al. | 371/37 |
| 5,537,112 | 7/1996 | Tsang | 341/59 |

OTHER PUBLICATIONS

Siegel, Paul H., et al., Modulation and Coding for Information Storage, Dec. 1991, pp. 68–86.
Karabed, Razmik, et al., Matched Spectral-Null Codes for Partial-Responser Channels, May 1991, vol. 37, No. 3, pp. 818–855.

*Primary Examiner*—Brian K. Young
*Attorney, Agent, or Firm*—Kinney & Lange, P.A.

[57] ABSTRACT

An apparatus encodes data blocks into code blocks, each code block containing more symbols than its respective data block. The apparatus includes a data block latch for receiving individual data blocks and for dividing each data block into two sub-blocks. An encoder receives one of the data sub-blocks and encodes the first data sub-block as a code sub-block. An interleaver, coupled to the encoder and the data block latch, combines the code sub-block with the second data sub-block to produce a code block, such that when the code blocks are concatenated with each other to produce a string of code symbols no more than five consecutive occurrences of a particular code symbol are present in the string of code symbols.

20 Claims, 5 Drawing Sheets

(HEX)

|    | 0 | 1 | 2 | 3 | 4 | 5 | 6 | 7 | 8 | 9 | A | B | C | D | E | F |
|----|---|---|---|---|---|---|---|---|---|---|---|---|---|---|---|---|
| 00: | 139 | 3F1 | 3F2 | 3F3 | 3F4 | 3F5 | 3F6 | 3F7 | 13D | 3F9 | 3FA | 3FB | 3FC | 3FD | 3FE | 3FF |
| 01: | 13A | 2D4 | 3E2 | 3E3 | 3E4 | 3E5 | 3E6 | 3E7 | 13E | 3E9 | 3EA | 3EB | 3EC | 3ED | 3EE | 3EF |
| 02: | 252 | 3D1 | 3D2 | 3D3 | 3D4 | 3D5 | 3D6 | 3D7 | 262 | 3D9 | 3DA | 3DB | 3DC | 3DD | 3DE | 3DF |
| 03: | 253 | 1B9 | 1BA | 1BB | 1BC | 1BD | 1BE | 1BF | 263 | 3C9 | 3CA | 3CB | 3CC | 3CD | 3CE | 3CF |
| 04: | 254 | 3B1 | 3B2 | 3B3 | 3B4 | 3B5 | 3B6 | 3B7 | 264 | 449 | 44A | 44B | 44C | 44D | 44E | 44F |
| 05: | 255 | 451 | 452 | 453 | 454 | 455 | 456 | 457 | 265 | 459 | 45A | 45B | 45C | 45D | 45E | 45F |
| 06: | 256 | 391 | 462 | 463 | 464 | 465 | 466 | 467 | 266 | 469 | 46A | 46B | 46C | 46D | 46E | 46F |
| 07: | 257 | 471 | 472 | 473 | 474 | 475 | 476 | 477 | 267 | 479 | 47A | 47B | 47C | 47D | 47E | 47F |
| 08: | 13B | 371 | 372 | 373 | 374 | 375 | 376 | 377 | 13F | 379 | 37A | 37B | 37C | 37D | 37E | 37F |
| 09: | 259 | 491 | 492 | 493 | 494 | 495 | 496 | 497 | 269 | 499 | 49A | 49B | 49C | 49D | 49E | 49F |
| 0A: | 25A | 351 | 4A2 | 4A3 | 4A4 | 4A5 | 4A6 | 4A7 | 26A | 4A9 | 4AA | 4AB | 4AC | 4AD | 4AE | 4AF |
| 0B: | 25B | 4B1 | 4B2 | 4B3 | 4B4 | 4B5 | 4B6 | 4B7 | 26B | 4B9 | 4BA | 4BB | 4BC | 4BD | 4BE | 4BF |
| 0C: | 25C | 331 | 332 | 333 | 334 | 335 | 336 | 337 | 26C | 4C9 | 4CA | 4CB | 4CC | 4CD | 4CE | 4CF |
| 0D: | 25D | 4D1 | 4D2 | 4D3 | 4D4 | 4D5 | 4D6 | 4D7 | 26D | 4D9 | 4DA | 4DB | 4DC | 4DD | 4DE | 4DF |
| 0E: | 25E | 2D5 | 4E2 | 4E3 | 4E4 | 4E5 | 4E6 | 4E7 | 26E | 4E9 | 4EA | 4EB | 4EC | 4ED | 4EE | 4EF |
| 0F: | 25F | 4F1 | 4F2 | 4F3 | 4F4 | 4F5 | 4F6 | 4F7 | 26F | 4F9 | 4FA | 4FB | 4FC | 4FD | 4FE | 4FF |
| 10: | 149 | 2F1 | 2F2 | 2F3 | 2F4 | 2F5 | 2F6 | 2F7 | 14D | 2F9 | 2FA | 2FB | 2FC | 2FD | 2FE | 2FF |
| 11: | 14A | 2D6 | 2E2 | 2E3 | 2E4 | 2E5 | 2E6 | 2E7 | 14E | 2E9 | 2EA | 2EB | 2EC | 2ED | 2EE | 2EF |
| 12: | 292 | 2D1 | 522 | 523 | 524 | 525 | 526 | 527 | 2A2 | 529 | 52A | 52B | 52C | 52D | 52E | 52F |
| 13: | 293 | 531 | 532 | 533 | 534 | 535 | 536 | 537 | 2A3 | 539 | 53A | 53B | 53C | 53D | 53E | 53F |
| 14: | 294 | 2B1 | 2B2 | 2B3 | 2B4 | 2B5 | 2B6 | 2B7 | 2A4 | 549 | 54A | 54B | 54C | 54D | 54E | 54F |
| 15: | 295 | 551 | 552 | 553 | 554 | 555 | 556 | 557 | 2A5 | 559 | 55A | 55B | 55C | 55D | 55E | 55F |
| 16: | 296 | 291 | 562 | 563 | 564 | 565 | 566 | 567 | 2A6 | 569 | 56A | 56B | 56C | 56D | 56E | 56F |
| 17: | 297 | 571 | 572 | 573 | 574 | 575 | 576 | 577 | 2A7 | 579 | 57A | 57B | 57C | 57D | 57E | 57F |
| 18: | 14B | 271 | 272 | 273 | 274 | 275 | 276 | 277 | 14F | 279 | 27A | 27B | 27C | 27D | 27E | 27F |
| 19: | 299 | 591 | 592 | 593 | 594 | 595 | 596 | 597 | 2A9 | 599 | 59A | 59B | 59C | 59D | 59E | 59F |
| 1A: | 29A | 251 | 5A2 | 5A3 | 5A4 | 5A5 | 5A6 | 5A7 | 2AA | 5A9 | 5AA | 5AB | 5AC | 5AD | 5AE | 5AF |
| 1B: | 29B | 5B1 | 5B2 | 5B3 | 5B4 | 5B5 | 5B6 | 5B7 | 2AB | 5B9 | 5BA | 5BB | 5BC | 5BD | 5BE | 5BF |
| 1C: | 29C | 2B9 | 2BA | 2BB | 2BC | 2BD | 2BE | 2BF | 2AC | 5C9 | 5CA | 5CB | 5CC | 5CD | 5CE | 5CF |
| 1D: | 29D | 5D1 | 5D2 | 5D3 | 5D4 | 5D5 | 5D6 | 5D7 | 2AD | 5D9 | 5DA | 5DB | 5DC | 5DD | 5DE | 5DF |
| 1E: | 29E | 2D7 | 5E2 | 5E3 | 5E4 | 5E5 | 5E6 | 5E7 | 2AE | 5E9 | 5EA | 5EB | 5EC | 5ED | 5EE | 5EF |
| 1F: | 29F | 5F1 | 5F2 | 5F3 | 5F4 | 5F5 | 5F6 | 5F7 | 2AF | 5F9 | 5FA | 5FB | 5FC | 5FD | 5FE | 5FF |

FIG. 2A (HEX)

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 20: | 339 | 1F1 | 1F2 | 1F3 | 1F4 | 1F5 | 1F6 | 1F7 | 33D | 1F9 | 1FA | 1FB | 1FC | 1FD | 1FE | 1FF |
| 21: | 33A | 2DC | 1E2 | 1E3 | 1E4 | 1E5 | 1E6 | 1E7 | 33E | 1E9 | 1EA | 1EB | 1EC | 1ED | 1EE | 1EF |
| 22: | 352 | 1D1 | 1D2 | 1D3 | 1D4 | 1D5 | 1D6 | 1D7 | 362 | 1D9 | 1DA | 1DB | 1DC | 1DD | 1DE | 1DF |
| 23: | 353 | 3B9 | 3BA | 3BB | 3BC | 3BD | 3BE | 3BF | 363 | 1C9 | 1CA | 1CB | 1CC | 1CD | 1CE | 1CF |
| 24: | 354 | 1B1 | 1B2 | 1B3 | 1B4 | 1B5 | 1B6 | 1B7 | 364 | 649 | 64A | 64B | 64C | 64D | 64E | 64F |
| 25: | 355 | 651 | 652 | 653 | 654 | 655 | 656 | 657 | 365 | 659 | 65A | 65B | 65C | 65D | 65E | 65F |
| 26: | 356 | 191 | 662 | 663 | 664 | 665 | 666 | 667 | 366 | 669 | 66A | 66B | 66C | 66D | 66E | 66F |
| 27: | 357 | 671 | 672 | 673 | 674 | 675 | 676 | 677 | 367 | 679 | 67A | 67B | 67C | 67D | 67E | 67F |
| 28: | 33B | 171 | 172 | 173 | 174 | 175 | 176 | 177 | 33F | 179 | 17A | 17B | 17C | 17D | 17E | 17F |
| 29: | 359 | 691 | 692 | 693 | 694 | 695 | 696 | 697 | 369 | 699 | 69A | 69B | 69C | 69D | 69E | 69F |
| 2A: | 35A | 151 | 6A2 | 6A3 | 6A4 | 6A5 | 6A6 | 6A7 | 36A | 6A9 | 6AA | 6AB | 6AC | 6AD | 6AE | 6AF |
| 2B: | 35B | 6B1 | 6B2 | 6B3 | 6B4 | 6B5 | 6B6 | 6B7 | 36B | 6B9 | 6BA | 6BB | 6BC | 6BD | 6BE | 6BF |
| 2C: | 35C | 131 | 132 | 133 | 134 | 135 | 136 | 137 | 36C | 6C9 | 6CA | 6CB | 6CC | 6CD | 6CE | 6CF |
| 2D: | 35D | 6D1 | 6D2 | 6D3 | 6D4 | 6D5 | 6D6 | 6D7 | 36D | 6D9 | 6DA | 6DB | 6DC | 6DD | 6DE | 6DF |
| 2E: | 35E | 2DD | 6E2 | 6E3 | 6E4 | 6E5 | 6E6 | 6E7 | 36E | 6E9 | 6EA | 6EB | 6EC | 6ED | 6EE | 6EF |
| 2F: | 35F | 6F1 | 6F2 | 6F3 | 6F4 | 6F5 | 6F6 | 6F7 | 36F | 6F9 | 6FA | 6FB | 6FC | 6FD | 6FE | 6FF |
| 30: | 349 | 24F | 122 | 123 | 124 | 125 | 126 | 127 | 34D | 129 | 12A | 12B | 12C | 12D | 12E | 12F |
| 31: | 34A | 2DE | 192 | 193 | 194 | 195 | 196 | 197 | 34E | 199 | 19A | 19B | 19C | 19D | 19E | 19F |
| 32: | 392 | 24E | 722 | 723 | 724 | 725 | 726 | 727 | 3A2 | 729 | 72A | 72B | 72C | 72D | 72E | 72F |
| 33: | 393 | 731 | 732 | 733 | 734 | 735 | 736 | 737 | 3A3 | 739 | 73A | 73B | 73C | 73D | 73E | 73F |
| 34: | 394 | 24D | 152 | 153 | 154 | 155 | 156 | 157 | 3A4 | 749 | 74A | 74B | 74C | 74D | 74E | 74F |
| 35: | 395 | 751 | 752 | 753 | 754 | 755 | 756 | 757 | 3A5 | 759 | 75A | 75B | 75C | 75D | 75E | 75F |
| 36: | 396 | 24C | 762 | 763 | 764 | 765 | 766 | 767 | 3A6 | 769 | 76A | 76B | 76C | 76D | 76E | 76F |
| 37: | 397 | 771 | 772 | 773 | 774 | 775 | 776 | 777 | 3A7 | 779 | 77A | 77B | 77C | 77D | 77E | 77F |
| 38: | 34B | 24B | 1A2 | 1A3 | 1A4 | 1A5 | 1A6 | 1A7 | 34F | 1A9 | 1AA | 1AB | 1AC | 1AD | 1AE | 1AF |
| 39: | 399 | 791 | 792 | 793 | 794 | 795 | 796 | 797 | 3A9 | 799 | 79A | 79B | 79C | 79D | 79E | 79F |
| 3A: | 39A | 24A | 7A2 | 7A3 | 7A4 | 7A5 | 7A6 | 7A7 | 3AA | 7A9 | 7AA | 7AB | 7AC | 7AD | 7AE | 7AF |
| 3B: | 39B | 7B1 | 7B2 | 7B3 | 7B4 | 7B5 | 7B6 | 7B7 | 3AB | 7B9 | 7BA | 7BB | 7BC | 7BD | 7BE | 7BF |
| 3C: | 39C | 249 | 162 | 163 | 164 | 165 | 166 | 167 | 3AC | 7C9 | 7CA | 7CB | 7CC | 7CD | 7CE | 7CF |
| 3D: | 39D | 7D1 | 7D2 | 7D3 | 7D4 | 7D5 | 7D6 | 7D7 | 3AD | 7D9 | 7DA | 7DB | 7DC | 7DD | 7DE | 7DF |
| 3E: | 39E | 2DF | 7E2 | 7E3 | 7E4 | 7E5 | 7E6 | 7E7 | 3AE | 7E9 | 7EA | 7EB | 7EC | 7ED | 7EE | 7EF |
| 3F: | 39F | 7F1 | 7F2 | 7F3 | 7F4 | 7F5 | 7F6 | 7F7 | 3AF | 7F9 | 7FA | 7FB | 7FC | 7FD | 7FE | 7FF |

FIG. 2B

FIGURE 3: GROUP K

| DATA | CODE | DATA | CODE | DATA | CODE | DATA | CODE |
|------|------|------|------|------|------|------|------|
| 020 | 252 | 120 | 292 | 220 | 352 | 320 | 392 |
| 030 | 253 | 130 | 293 | 230 | 353 | 330 | 393 |
| 040 | 254 | 140 | 294 | 240 | 354 | 340 | 394 |
| 050 | 255 | 150 | 295 | 250 | 355 | 350 | 395 |
| 060 | 256 | 160 | 296 | 260 | 356 | 360 | 396 |
| 070 | 257 | 170 | 297 | 270 | 357 | 370 | 397 |
| 090 | 259 | 190 | 299 | 290 | 359 | 390 | 399 |
| 0A0 | 25A | 1A0 | 29A | 2A0 | 35A | 3A0 | 39A |
| 0B0 | 25B | 1B0 | 29B | 2B0 | 35B | 3B0 | 39B |
| 0C0 | 25C | 1C0 | 29C | 2C0 | 35C | 3C0 | 39C |
| 0D0 | 25D | 1D0 | 29D | 2D0 | 35D | 3D0 | 39D |
| 0E0 | 25E | 1E0 | 29E | 2E0 | 35E | 3E0 | 39E |
| 0F0 | 25F | 1F0 | 29F | 2F0 | 35F | 3F0 | 39F |
| 028 | 262 | 128 | 2A2 | 228 | 362 | 328 | 3A2 |
| 038 | 263 | 138 | 2A3 | 238 | 363 | 338 | 3A3 |
| 048 | 264 | 148 | 2A4 | 248 | 364 | 348 | 3A4 |
| 058 | 265 | 158 | 2A5 | 258 | 365 | 358 | 3A5 |
| 068 | 266 | 168 | 2A6 | 268 | 366 | 368 | 3A6 |
| 078 | 267 | 178 | 2A7 | 278 | 367 | 378 | 3A7 |
| 098 | 269 | 198 | 2A9 | 298 | 369 | 398 | 3A9 |
| 0A8 | 26A | 1A8 | 2AA | 2A8 | 36A | 3A8 | 3AA |
| 0B8 | 26B | 1B8 | 2AB | 2B8 | 36B | 3B8 | 3AB |
| 0C8 | 26C | 1C8 | 2AC | 2C8 | 36C | 3C8 | 3AC |
| 0D8 | 26D | 1D8 | 2AD | 2D8 | 36D | 3D8 | 3AD |
| 0E8 | 26E | 1E8 | 2AE | 2E8 | 36E | 3E8 | 3AE |
| 0F8 | 26F | 1F8 | 2AF | 2F8 | 36F | 3F8 | 3AF |

FIGURE 4: GROUP L

| DATA | CODE | DATA | CODE | DATA | CODE | DATA | CODE |
|------|------|------|------|------|------|------|------|
| 000 | 139 | 100 | 149 | 200 | 339 | 300 | 349 |
| 010 | 13A | 110 | 14A | 210 | 33A | 310 | 34A |
| 080 | 13B | 180 | 14B | 280 | 33B | 380 | 34B |
| 008 | 13D | 108 | 14D | 208 | 33D | 308 | 34D |
| 018 | 13E | 118 | 14E | 218 | 33E | 318 | 34E |
| 088 | 13F | 188 | 14F | 288 | 33F | 388 | 34F |

FIGURE 5: GROUP M

| DATA | CODE | DATA | CODE | DATA | CODE |
|------|------|------|------|------|------|
| 031 | 1B9 | 1C1 | 2B9 | 231 | 3B9 |
| 032 | 1BA | 1C2 | 2BA | 232 | 3BA |
| 033 | 1BB | 1C3 | 2BB | 233 | 3BB |
| 034 | 1BC | 1C4 | 2BC | 234 | 3BC |
| 035 | 1BD | 1C5 | 2BD | 235 | 3BD |
| 036 | 1BE | 1C6 | 2BE | 236 | 3BE |
| 037 | 1BF | 1C7 | 2BF | 237 | 3BF |

FIGURE 6: GROUP N

| DATA | CODE | DATA | CODE | DATA | CODE | DATA | CODE |
|------|------|------|------|------|------|------|------|
| 302 | 122 | 312 | 192 | 382 | 1A2 | 342 | 152 |
| 303 | 123 | 313 | 193 | 383 | 1A3 | 343 | 153 |
| 304 | 124 | 314 | 194 | 384 | 1A4 | 344 | 154 |
| 305 | 125 | 315 | 195 | 385 | 1A5 | 345 | 155 |
| 306 | 126 | 316 | 196 | 386 | 1A6 | 346 | 156 |
| 307 | 127 | 317 | 197 | 387 | 1A7 | 347 | 157 |
| 309 | 129 | 319 | 199 | 389 | 1A9 |  |  |
| 30A | 12A | 31A | 19A | 38A | 1AA | 3C2 | 162 |
| 30B | 12B | 31B | 19B | 38B | 1AB | 3C3 | 163 |
| 30C | 12C | 31C | 19C | 38C | 1AC | 3C4 | 164 |
| 30D | 12D | 31D | 19D | 38D | 1AD | 3C5 | 165 |
| 30E | 12E | 31E | 19E | 38E | 1AE | 3C6 | 166 |
| 30F | 12F | 31F | 19F | 38F | 1AF | 3C7 | 167 |

FIGURE 7: GROUP P

| DATA | CODE | DATA | CODE | DATA | CODE | DATA | CODE |
|------|------|------|------|------|------|------|------|
| 011 | 2D4 | 111 | 2D6 | 211 | 2DC | 311 | 2DE |
| 0E1 | 2D5 | 1E1 | 2D7 | 2E1 | 2DD | 3E1 | 2DF |

FIGURE 8: GROUP Q

| DATA | CODE | DATA | CODE | DATA | CODE | DATA | CODE |
|------|------|------|------|------|------|------|------|
| 301 | 24F | 341 | 24D | 381 | 24B | 3C1 | 249 |
| 321 | 24E | 361 | 24C | 3A1 | 24A |  |  |

METHOD AND APPARATUS FOR IMPLEMENTING RUN LENGTH LIMITED CODES

This application claims priority from U.S. Provisional Application Ser. No. 60/023,225 filed on Aug. 5, 1996.

BACKGROUND OF THE INVENTION

The present invention relates to encoding data for transmission through a channel and for decoding such encoded data after its transmission through a channel. In particular, the present invention relates to encoders and decoders which implement run length limited codes.

Information that is transmitted from a source to a destination can be considered generically to pass through a channel. In some communication systems, the channel comprises electromagnetic radiation passing through the atmosphere. In other communication systems, the channel comprises a long conductor between the source and destination. Still other communication systems comprise a magnetic disk, where information from the source is stored on the disk and later retrieved from the disk for delivery to the destination.

In each communication system, the information transmitted through the channel can be corrupted by noise within the channel so that the information transmitted from the source is not the same as the information received by the destination. To identify when such errors have occurred, and in some cases to correct such errors, information is typically encoded at the source using a code that can be decoded at the destination. The code is designed to have a set of valid codewords that satisfy certain coding constraints, both as individual codewords and as a collection of concatenated codewords. When the destination receives values that violate the coding constraints, it knows that there has been an error.

Typically, such encoding involves translating a block of input information containing a number of information symbols into a block of coded information containing a number of coded symbols. The ratio of the number of symbols in the input information to the number of symbols in the encoded information is known as the rate of the code. Thus, if 16 symbols of information are encoded as 17 coded symbols the rate of the code is 16/17. The number of coded symbols is always greater than the number of input symbols, so the rate is always less than one. However, it is advantageous to use codes that have the highest possible rate since higher rate codes are more efficient than lower rate codes. High rate codes are efficient because each code symbol transmitted through the channel requires time and energy. If fewer code symbols are transmitted through the channel for a give number of input symbols, less time and energy is used by the channel to transmit the input data. Thus, a rate 16/17 code is more efficient than a rate 16/18 code since the 16/17 code can transmit 16 symbols of input data using one less symbol of code data than the 16/18 code.

In many communication systems, including magnetic disk drives, the decoder must be synchronized to the rate at which the coded symbols are produced by the channel. This is typically accomplished using a phase lock oscillator (PLO), also known as a phase locked loop. The phase locked loop creates a clock signal that is synchronized to the average time between transitions in the channel signal. Since the phase locked loop requires transitions in the signal in order to synchronize the clock signal, the encoder must limit the length of time separating transitions in the encoded information so that the phase locked loop's clock signal does not begin to deteriorate. This limitation is known as a run-length-limited (RLL) coding constraint.

In many systems, a binary value of "1" represents a transition in the channel signal and a binary value of "0" represents a lack of transitions in the channel signal. Thus, under a run-length-limited code, the encoder must limit the number of consecutive zeros used to create the channel signal. The limitation on the number of consecutive "zeros" is sometimes referred to as the "k" constraint.

In practice, it is difficult to find a high rate code that is simple to implement and that meets the run-length-limited constraint. For instance, to implement a rate 16/17 code that satisfies a run-length-limited constraint of "k"=5, requires selecting $65,536(2^{16})$ codewords that meet the "k"=5 constraint out of a possible $131,072(2^{17})$ possible codewords. Not only must the codewords themselves meet the run-length-limited constraint, but also their concatenation with all other possible codewords must meet the run-length-limited constraint.

Simply finding such codewords is extremely burdensome. However, finding such codewords is simple compared to constructing an encoder to encode the data into the selected codewords. Such encoders are complex since they usually attempt to find commonalities between codewords that allow for mapping between data and codewords based on fewer than all of the symbols in a section of data.

SUMMARY OF THE INVENTION

The present invention is an apparatus for encoding data blocks into code blocks. Individual data blocks are received by a data block latch which divides each data block into two data sub-blocks. An encoder receives the first data sub-block and encodes the first data sub-block into a first code sub-block. An interleaver receives the first code sub-block and the second data sub-block and combines the two sub-blocks to produce a code block. The code blocks created by the interleaver are such that when they are concatenated together, they produce a string of code symbols with no more than five consecutive occurrences of the same code symbol.

In preferred embodiments, some of the first data sub-blocks are encoded by simply inserting a code symbol into the first data sub-blocks. Preferably, each added code symbol is inserted at an end of each first data sub-block. Since it is easy to implement an encoder which merely adds a code symbol to produce a code sub-block, it is preferred that a majority of the first data sub-blocks be encoded through this method.

Typically, the present invention is used in coding systems that are based on a set of binary symbols where the two symbols in the binary set are the inverse of each other. For example, in most digital systems, the set of binary symbols is "0" and "1", where "0" is the inverse of "1" and "1" is the inverse of "0".

In a preferred embodiment of the present invention, at least some of the code sub-blocks are formed by inverting some, but not all, of the data symbols in some of the first data sub-blocks. The data symbols that are inverted are selected based on their position within the data sub-block so that the data symbols that are inverted occur in the same position in each data sub-block that is encoded in this manner. After the inversion of the selected data symbols, an additional code symbol is inserted into each mixed block of inverted and non-inverted data symbols.

It is preferred that a majority of the first data sub-blocks are encoded either by simply adding a code symbol to the data sub-block or by inverting a select group of the data symbols. This is preferred because these simple coding techniques can be implemented with few components, and if more data sub-blocks are encoded using theses techniques, fewer components are required to implement the encoder.

The method and apparatus of the present invention is particularly suited for creating a rate 16/17 code by dividing 16-bit digital words into 10-bit first data sub-blocks and 6-bit second data sub-blocks. The 10-bit data sub-blocks are encoded by the encoder into 11-bit code sub-blocks. The 11-bit code sub-blocks are then interleaved, or combined, with the 6-bit second data sub-blocks to create a 17-bit code block or codeword. Preferably, the concatenation of the codewords forms a code string that fulfills a "k"=5 constraint.

BRIEF DESCRIPTION OF THE DRAWINGS

FIGS. 2A and 2B are mapping tables, which together show the mapping between 10 bit data sub-blocks and 11 bit code sub-blocks for the present invention.

FIG. 3 is a mapping table for data sub-blocks and code sub-blocks in group K.

FIG. 4 is a mapping table for data sub-blocks and code sub-blocks in group L.

FIG. 5 is a mapping table for data sub-blocks and code sub-blocks in group M.

FIG. 6 is a mapping table for data sub-blocks and code sub-blocks in group N.

FIG. 7 is a mapping table for data sub-blocks and code sub-blocks in group P.

FIG. 8 is a mapping table for data sub-blocks and code sub-blocks in group Q.

DETAILED DESCRIPTION OF THE PREFERRED EMBODIMENTS

Figure 1:
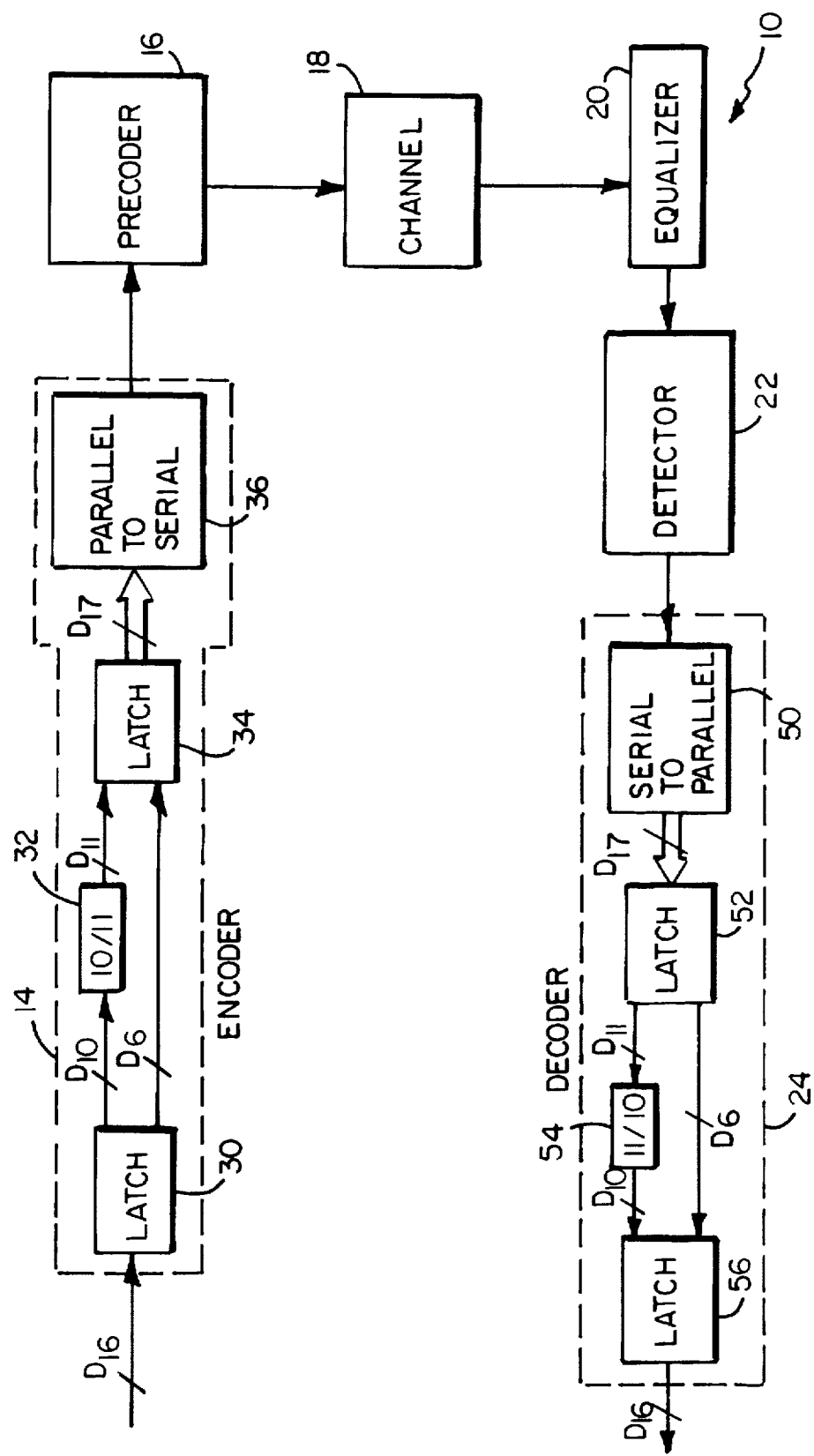
FIG. 1 is a block diagram of a communication system of the present invention.

FIG. 1 is a block diagram of encoding/decoding apparatus 10, which utilizes a 16/17 rate RLL code. The original data is received by latch 30 of encoder 14 along a 16-bit line. Latch 30 divides each 16-bit data block into one 6-bit data sub-block and one 10-bit data sub-block. The 10-bit data sub-block is input to 10/11-rate encoder 32, which encodes each 10-bit data sub-block into an 11-bit code sub-block through a process described further below. The 11-bit code sub-block and the 6-bit data sub-block are received by latch 34, which is coupled to 10/11-rate encoder 32 and latch 30. Latch 34 combines the 11-bit code sub-block and the 6-bit data sub-block, in a manner described below, to produce a 17-bit code block. The 17-bit code block is input to parallel-to-serial converter 36, which sequentially outputs the individual bits of each code block. With each new code block, parallel-to-serial converter 36 concatenates the preceding code block to the current code block by simply performing the parallel-to-serial conversion.

Pre-coder 16, which is connected to parallel-to-serial converter 36 of encoder 14, receives the code symbols of the concatenated code blocks and performs additional operations on the code symbols to optimize the efficiency of their transmission through the channel. Typically, pre-coder 16 has a transfer function of $1/(1 \oplus D)$, where "1" represents the input signal, "D" represents the input signal delayed by one time unit, and $\oplus$ represents the EXCLUSIVE-OR logic operation. Pre-coders with this type of transfer function are known as NRZI pre-coders. Alternatively, pre-coder 16 can have a transfer function of $1/(1+D^2)$, where "1" represents the input signal and "$D^2$" represents the input signal delayed by two time units. Pre-coders with this type of transfer function are known as interleaved NRZI pre-coders. The two pre-coders referenced above are simply examples of possible pre-coders and those skilled in the art will recognize that other pre-coders may be used in their place.

Pre-coder 16 is connected to channel 18, which in magnetic disk drives comprises a magnetic medium and magnetic heads used to "write" magnetic information to the magnetic medium and "read" magnetic information from the magnetic medium. The output from channel 18 is received by an equalizer 20 which optimizes the channel output signal for desired characteristics. These desired characteristics are usually dictated by the natural characteristics of channel 18 and the type of detection method used by a detector 22, which receives the equalized signals from equalizer 20.

Detector 22 may comprise any one of a number of detectors including a Viterbi detector, a Decision Feedback Equalizer (DFE), or a Fixed Delay Tree Search (FDTS) detector. Those skilled in the art will recognize that any of these detectors may be used as detector 22, as long as pre-coder 16 is selected to match the chosen detector. Detector 22 converts the equalized signal from equalizer 20 into a digital representation of the output digital signal produced by parallel-to-serial converter 36.

The digital signal from detector 22 is input to serial-to-parallel convertor 50 of decoder 24. Serial-to-parallel convertor 50 converts the serial digital values from detector 22 into parallel groups of 17-bit code blocks. The code blocks are input to latch 52 along a 17-bit line. Latch 52 divides each 17-bit code block into an 11-bit code sub-block and a 6-bit data sub-block. The division is accomplished using a reverse mapping of the mapping used by latch 34 to combine the 11-bit code sub-block from 10/11-rate encoder 32 and the 6-bit data sub-block from latch 30. The 11-bit code sub-block from latch 52 is input to 11/10-rate decoder 54 which decodes the 11-bit code sub-block into a 10-bit data sub-block through a process described further below.

The 10-bit data sub-block from 11/10-rate decoder 54 and the 6-bit data sub-block from latch 52 are combined by latch 56 into a 16-bit data block. Latch 56 combines the two data sub-blocks by using the inverse of the mapping used by latch 30 to divide the 16-bit input data block into 6-bit and 10-bit data sub-blocks.

Returning to the mappings performed by encoder 14, latch 30 of encoder 14 divides a data block denoted as D into two data sub-blocks denoted as A and B, wherein:

$$D \triangleq [D_{15} D_{14} D_{13} D_{12} D_{11} D_{10} D_9 D_8 D_7 D_6 D_5 D_4 D_3 D_2 D_1 D_0], \quad (1)$$

$$A \triangleq [A_9 A_8 A_7 A_6 A_5 A_4 A_3 A_2 A_1 A_0], \quad 2)$$

and $$B \triangleq [B_5 B_4 B_3 B_2 B_1 B_0]. \quad (3)$$

Data sub-block A is encoded by 10/11-rate encoder 32 into an 11-bit code sub-block C, wherein:

$$C \triangleq [C_{10} C_9 C_8 C_7 C_6 C_5 C_4 C_3 C_2 C_1 C_0]. \quad (4)$$

The encoding performed to produce code sub-block C is discussed further below. Latch 34 combines code sub-block C and data sub-block B to form code block W, wherein:

$$W \triangleq [C_{10} C_9 B_5 C_8 B_4 C_7 C_6 B_3 B_2 C_5 C_4 B_1 C_3 B_0 C_2 C_1 C_0], \quad (5)$$

To ensure that the 17-bit code blocks W and the concatenation of the code blocks with each other meet the "k"=5 constraint, the bits of code sub-block C must satisfy all seven of the following equations:

$$C_{10}+C_9+C_8=1 \quad (6)$$

$$C_8+C_7+C_6=1 \quad (7)$$

$$C_7+C_6+C_5=1 \quad (8)$$

$$C_6+C_5+C_4=1 \quad (9)$$

$$C_5+C_4+C_3=1 \quad (10)$$

$$C_4+C_3+C_2+C_1=1 \quad (11)$$

$$C_2+C_1+C_0=1, \quad (12)$$

wherein the bits of sub-block C have values of either "0" or "1" and "+" denotes a logical OR operation. When all of these equations are true, a code block W will not have more than 5 consecutive zeros even when concatenated with other code blocks.

Specifically, equations 6 and 12 ensure that the "k"=5 constraint is not violated when two code blocks are concatenated. For instance, if a code block $W_s$ is concatenated with a code block $W_{s-1}$, where $W_s$ and $W_{s-1}$ are both constructed using equation 5, the concatenation will produce a string of bits consisting of [$B_0$, $C_2$, $C_1$, $C_0$, $C_{10}$, $C_9$, $B_5$, $C_8$]. Equations 6 and 12 together ensure that in a worst case situation this concatenated string will not violate the "k"=5 constraint. Specifically, with equations 6 and 12, the worst case situation is when $C_2$="1", $C_8$="1", and the remaining bits in the string are equal to "0". However, even under this worst case, there are only 5 bits between $C_2$ and $C_8$, so there are at most 5 consecutive zeros in the concatenation of code block $W_s$ and code block $W_{s-1}$.

Those skilled in the art will recognize that the order of bits in Equation 5 may be reversed without affecting the requirements of Equations 6–12, as long as each code block is constructed in the same manner as all other code blocks. Thus latch 34 may form code block W as:

$$W\Delta|C_0C_1C_2B_0C_3B_1C_4C_5B_2B_3C_6C_7B_4C_8B_5C_9C_{10}|, \quad (13)$$

without changing Equations 6–12, as long as all code blocks W have the order shown in Equation 13.

Those skilled in the art will also recognize that the particular code bits assigned to a particular position in Equations 5 and 13 may be changed as long as: the relative order of code-bits to data-bits shown in Equations 5 and 13 remains unchanged; the position of particular code bits in W is the same for all codewords; and Equations 6–12 are modified to reflect the change in position of specific code bits. Thus, if code bits $C_{10}$ and $C_0$ are swapped in Equation 5 so that $C_0$ is the most significant bit in W and $C_{10}$ is the least significant bit in W, Equations 6 and 12 become:

$$C_0+C_9+C_8=1 \quad (14)$$

$$C_2+C_1+C_{10}=1, \quad (15)$$

respectively.

In the discussion below, specific coding methods are described for a 10/11-rate encoder used with latch 34 to create code blocks based on Equation 5. Those skilled in the art will recognize that appropriate changes may be made to the encoder if the location of specific code bits within Equation 5 is changed while maintaining the relative position of code bits to data bits in Equation 5. Thus, if $C_{10}$ and $C_0$ are switched with each other in Equation 5, suitable changes will need to be made to the equations described below.

Of the 2,048 ($2^{11}$) possible 11-bit patterns for the code sub-block C, only 1,067 satisfy the conditions in the equations 6–12. This is more than the number necessary to map each 10-bit data sub-block into the 11-bit code sub-block since there are only 1,024 ($2^{10}$) possible 10-bit patterns. FIGS. 2A and 2B show the one-to-one mapping used by the present invention to map each 10-bit data sub-block A to an 11-bit code sub-block C using Equation 5 to create the code blocks. FIGS. 2A and 2B use a hexadecimal format to represent the sub-blocks with the least significant hexadecimal value of data sub-block A represented in the top lines of the tables and the two most significant hexadecimal digits of data sub-block A represented in the left most columns of the respective tables.

The 1,024 possible combinations of symbols that can be found in data sub-block A can be divided into three types, identified by the following equations:

$$T_1=(A_8+A_7+A_6)*(A_7+A_6+A_5)*(A_6+A_5+A_4)*(A_5+A_4+A_3)*(A_4+A_3A_2+A_1)*(A_2+A_1+A_0) \quad (16)$$

$$T_2=|(\bar{A_9}+\bar{A_8})*(\bar{A_8}+\bar{A_7}+\bar{A_6})*(\bar{A_7}+\bar{A_6}+\bar{A_5})*(A_6+A_5+A_4)*(A_5+A_4+A_3)*(A_4+A_3+A_2+A_1)*(A_2+A_1+A_0)|*T_1 \quad (17)$$

$$T_3=(\bar{T_1}*\bar{T_2}) \quad (18)$$

where "*" denotes a logical AND operation, "+" denotes a logical OR operation, and "$\bar{x}$" denotes an inversion or a logical NOT operation of the value "x". In addition, $T_1$, $T_2$, and $T_3$ act as Boolean variables that indicate whether a particular data sub-block belongs to type I, II or III, respectively. When one of the Boolean variables is equal to "0", the data sub-block is not of the type represented by the variable, and when the variable is equal to "1" the data sub-block is of the type represented by the variable. For instance, when equation 16 equals "1", data sub-block A is a type I data sub-block.

For those data sub-blocks that fall within type I, 10/11-rate encoder 32 creates code word sub-block C from data sub-block A by assigning the bits of data sub-block A to the least significant bits of code sub-block C and assigning "1" to the most significant bit of code sub-block C. In other words, 10/11 rate encoder 32 performs the following assignments:

$$C_{10}="1", C_9=A_9, C_8=A_8, C_7=A_7, C_6=A_6, C_5=A_5, C_4=A_4, C_3=A_3,$$
$$C_2=A_2, C_1=A_1, C_0=A_0. \quad (19)$$

Since this mapping is extremely easy to implement, requiring only that a one be concatenated to data sub-block A, it greatly reduces the complexity of 10/11-rate encoder 32. Moreover, since there are a total of 602 patterns in data sub-block A that belong to type I, a majority of the data sub-blocks can be encoded using this simple system.

For data sub-blocks that satisfies the conditions of type II, 10/11-rate encoder 32 inverts bits $A_4$ through $A_9$ to create code bits $C_4$ through $C_9$; data bits $A_0$ through $A_3$ are assigned directly to code bits $C_0$ through $C_3$; and the most significant bit of code sub-block C is assigned "0". In other words, the 11-bits of code sub-block C are assigned the following values:

$$C_{10}="0", C_9=\bar{A_9}, C_8=\bar{A_8}, C_7=\bar{A_7}, C_6=\bar{A_6}, C_5=\bar{A_5}, C_4=\bar{A_4}, C_3=A_3,$$
$$C_2=A_2, C_1=A_1 \text{ and } C_0=A_0, \quad (20)$$

where "$\bar{x}$" denotes the inversion of "x".

Of the 1,024 possible patterns for data sub-block A, 207 belong to type II. Thus, there are 809 patterns for data sub-block A that are either type I or II. Since there are only 1,024 possible patterns for data sub-block A, nearly 80 percent of the possible patterns are type I or II. This means that 80 percent of the data sub-blocks can be encoded using very simple logic circuits.

The remaining 215 patterns for data sub-block A belong to type III. To make the encoder/decoder design simpler, sub-blocks are grouped together based on commonalities with other sub-blocks. In one embodiment of the present invention, the type III data sub-blocks are organized into six groups: K, L, M, N, P, Q. The one-to-one mapping between code sub-blocks and data sub-blocks in groups K, L, M, N, P, Q are shown in FIGS. 3, 4, 5, 6, 7 and 8, respectively. The six groups of type III data sub-blocks are identified by six different Boolean variables, which are determined by evaluating expressions that evaluate to "1" if the data sub-block is part of the group and to "0" if the data sub-block is not part of the group. The Boolean variables have the same letter as the group they represent and are determined as follows:

$$K = (\bar{H}_8 * \bar{H}_1 * \bar{H}_0) * (J_8 + J_0) \tag{21}$$

$$L = (H_8 + H_1 + H_0) * (J_8 + J_0) \tag{22}$$

$$M = ((A_8 * H_3) + (G_1 * H_{12})) * A_3 * \bar{J}_0 \tag{23}$$

$$N = G_3 * \bar{J}_1 * \bar{J}_0 * (((H_8 + H_1 + H_0) * \bar{J}_8) + ((H_{12} + H_4) * \bar{A}_3)) \tag{24}$$

$$P = (H_{14} + H_1) * J_1 \tag{25}$$

$$Q = G_3 * \bar{H}_{14} * J_1 * \bar{A}_4, \tag{26}$$

where "*" denotes a logical AND operation, "+" denotes a logical OR operation and "x̄" denotes a logical NOT operation. The values for G, H and J are defined as follows:

$$G_1 = \bar{A}_9 * A_8 \tag{27}$$

$$G_3 = A_9 * A_8 \tag{28}$$

$$H_0 = \bar{A}_7 * \bar{A}_6 * \bar{A}_5 * \bar{A}_4 \tag{29}$$

$$H_1 = \bar{A}_7 * \bar{A}_6 * \bar{A}_5 * A_4 \tag{30}$$

$$H_3 = \bar{A}_7 * \bar{A}_6 * A_5 * A_4 \tag{31}$$

$$H_4 = \bar{A}_7 * A_6 * \bar{A}_5 * \bar{A}_4 \tag{32}$$

$$H_8 = A_7 * \bar{A}_6 * \bar{A}_5 * \bar{A}_4 \tag{33}$$

$$H_{12} = A_7 * A_6 * \bar{A}_5 * \bar{A}_4 \tag{34}$$

$$H_{14} = A_7 * A_6 * A_5 * \bar{A}_4 \tag{35}$$

$$J_0 = \bar{A}_3 * \bar{A}_2 * \bar{A}_1 * \bar{A}_0 \tag{36}$$

$$J_1 = \bar{A}_3 * \bar{A}_2 * \bar{A}_1 * A_0 \tag{37}$$

$$J_8 = A_3 * \bar{A}_2 * \bar{A}_1 * \bar{A}_0 \tag{38}$$

The production of the individual bits of code sub-block C can be expressed as individual equations by combining the above equations as follows:

$$C_{10} = T_1 \tag{39}$$

$$C_9 = (A_9 * T_1) + (A_9 * T_2) + ((K + (A_9 * L) + ((A_9 + A_8) * M) + P + Q) * T_3) \tag{40}$$

$$C_8 = (A_8 * T_1) + (A_8 * T_2) + (((A_9 * K) + L + (A_8 * M) + N) * T_3) \tag{41}$$

$$C_7 = (A_7 * T_1) + (\bar{A}_7 * T_2) + (((A_8 * K) + M + ((H_8 + H_1) * N) + P) * T_3) \tag{42}$$

$$C_6 = (A_6 * T_1) + (A_6 * T_2) + (((A_8 * K) + (A_8 * L) + (A_6 * N) + P + Q) * T_3) \tag{43}$$

$$C_5 = (A_5 * T_1) + (\bar{A}_5 * T_2) + (((J_8 * K) + (\bar{A}_8 * L) + M + ((A_7 + H_0) * N)) * T_3) \tag{44}$$

$$C_4 = (A_4 * T_1) + (\bar{A}_4 * T_2) + (((J_0 * K) + (\bar{A}_8 * L) + M + P + ((H_4 + H_1) * N)) * T_3) \tag{45}$$

$$C_3 = (A_3 * T_1) + (A_3 * T_2) + (((A_7 * K) + L + M + (A_3 * N) + (A_9 * P) + Q) * T_3) \tag{46}$$

$$C_2 = (A_2 * T_1) + (A_2 * T_2) + (((A_6 * K) + (A_3 * L) + (A_2 * M) + (A_2 * N) + P + (A_7 * Q)) * T_3) \tag{47}$$

$$C_1 = (A_1 * T_1) + (A_1 * T_2) + (((A_5 * K) + ((A_7 + A_4) * L) + (A_1 * M) + (A_1 * N) + (A_8 * P) + (A_6 * Q)) * T_3) \tag{48}$$

$$C_0 = (A_0 * T_1) + (A_0 * T_2) + (((A_4 * K) + (A_4 * L) + (A_0 * M) + (A_0 * N) + (A_4 * P) + (A_5 * Q)) * T_3) \tag{49}$$

Those skilled in the art will recognize that other partitions are possible, that Boolean expressions further reduced, or other equivalent expressions perhaps more constructive to implementing the particular logic gate circuits chosen for use, may be obtained from the present logic expression described in equations 21 through 49. Thus there other possible forms for the logic equations used in constructing 10/11-rate encoder 32. The equations shown are preferred but are not required for the present invention.

Latch 52 of decoder 24 of FIG. 1 uses the inverse of the map used by latch 34 to de-interleave data sub-block B from code sub-block C. Code sub-block C is provided to 11/10-rate decoder 54 which decodes the 11-bit code sub-block C into a 10-bit data sub-block A.

11/10-rate decoder 54 determines if code sub-block C is a valid code pattern by using the following equation:

$$V = |(C_{10} + C_9 + C_8) * (C_8 + C_7 + C_6) * (C_7 + C_6 + C_5) * (C_6 + C_5 + C_4) * (C_5 + C_4 + C_3) * (C_4 + C_3 + C_2 + C_1) * (C_2 + C_1 + C_0)|, \tag{50}$$

where V equals "1" if the code sub-block is valid, and V equals "0" if the code sub-block is invalid.

11/10-rate decoder 54 can also determine the type of data sub-block which created the code sub-block, i.e. type I, II, or III. Specifically, since the most significant bit, $C_{10}$, in a code sub-block is "1" if the code sub-block is derived from a type I data sub-block, a code sub-block is from a type I data sub-block if it is valid and its most significant bit is "1". In terms of a Boolean variable, $T_1$:

$$T_1 = (C_{10} * V) \tag{51}$$

where $T_1$ equals "1" when the code sub-block is derived from a type I data sub-block and $T_1$ equals "0" when the code sub-block is not derived from a type I data sub-block.

Code sub-blocks that were formed from type II data sub-blocks can also be identified through a Boolean expression. To construct such an expression, it is helpful to first recognize that the bits of type II data sub-blocks do not satisfy Equations 6–12 if a "1" is added as the most significant bit to form the code sub-block. If they did, they would be considered type I data sub-blocks. It should also be remembered that to construct a code sub-block from a type II data sub-block, bits $A_4$–$A_9$ of the type II data sub-block A are inverted and a "0" is added as the most significant bit of the code sub-block. Thus, inverting $C_4$–$C_{10}$ should create a sub-block that does not satisfy Equations 6–12 if the code sub-block was derived from a type II data sub-block. In other words, code sub-block C is derived from a type II data sub-block only if code sub-block C satisfies the following equation:

$$|(C_{10} + \bar{C}_9 + \bar{C}_8) * (C_8 + \bar{C}_7 + \bar{C}_6) * (C_7 + \bar{C}_6 + \bar{C}_5) * (C_6 + \bar{C}_5 + \bar{C}_4) * (C_5 + \bar{C}_4 + C_3) * (C_4 + C_3 + C_2 + C_1) * (C_2 + C_1 + C_0)| = 0 \tag{52}$$

Inverting this equation so that the expression on the left will equal "1" when code sub-block C is derived from a type II data sub-block and using DeMorgon's Law, equation 52 may be expressed as:

$|(C_{10}*C_9*C_8)+(C_8*C_7*C_6)+(C_7*\bar{C}_6*C_5)+(C_6*C_5*C_4)+$
$(C_5*C_4*\bar{C}_3)+(C_4*C_3*\bar{C}_2*\bar{C}_1)+(C_2*\bar{C}_1*C_0)|=1$ (53)

A code sub-block must satisfy two additional requirements in order to be properly identified as being derived from a type II data sub-block. First, the most significant bit of the code sub-block must be equal to "0". Second, the code sub-block must satisfy equation 50, in other words, it must be a valid code sub-block. Combining equation 53 with these limitations creates an equation that is equal to "1" when the code sub-block is derived from a type II data sub-block and is equal to "0" when the code sub-block is not derived from a type II data sub-block. In terms of the Boolean variable $T_2$, that equation is:

$T_2=|(C_8*C_7*C_6)+(C_7*C_6*C_5)+(C_6*C_5*C_4)+(C_5*C_4*\bar{C}_3)+$
$(C_4*\bar{C}_3*\bar{C}_2*\bar{C}_1)+(C_2*\bar{C}_1*C_0)|*\overline{C_{10}}*V$ (54)

where "*" denotes a logical AND operation, "+" denotes a logical OR operation, and "$\bar{x}$" denotes a logical NOT operation on the variable "x". Note that the $(C_{10}*C_9*C_8)$ term from equation 53 is not present in equation 54 since $C_{10}$ must equal zero and if $C_{10}$ is zero this entire term must equal zero.

Code sub-blocks that are valid but are not derived from type I or type II data sub-blocks, fall within a third group of sub-blocks identified by the Boolean variable $T_3$ and the expression:

$T_3=(T_2*\bar{C}_{10}*V)$ (55)

Note that the equation for $T_3$ does not guarantee that the code sub-block was actually generated by a type III data sub-block. There are additional valid code words that return of value of "1" for the equation 55 beyond those that are derived from a type III data sub-block. These additional code sub-blocks exist because there are 1,067 possible valid code sub-blocks but only 1,024 are needed to accommodate all of the possible patterns of the data sub-blocks. Thus, the additional 43 code sub-blocks that are not associated with a data sub-block will set flag $T_3$ to "1".

11/10-rate decoder 54 can identify the group—K,L,M,N, P, or Q—from which a code sub-block was derived by using the following equations:

$K=C_9*(H_5+H_6+H_9+H_{10})*(J_0*J_1*J_8)$ (56)

$L=C_8*(H_4+H_3)*(C_1+C_0)$ (57)

$M=(C_9+C_8)*H_{11}*C_3*J_8$ (58)

$N=G_1*(((H_6+H_5)*C_3*(C_1+C_2))+((H_{10}+H_9+H_2)*(J_0*J_1*J_8)))$ (59)

$P=G_2*H_{13}*C_2$ (60)

$Q=G_2*H_4*C_3*J_8$ (61)

where a value of "1" for an expression to the right of the equal sign indicates that the code sub-block was derived from a type III data sub-block from the particular group identified by the letter on the left. The G, H, and J terms are defined as:

$G_1=\bar{C}_{10}*\bar{C}_9*C_8$ (62)

$G_2=\bar{C}_{10}*C_9*\bar{C}_8$ (63)

$H_2=\bar{C}_7*\bar{C}_6*C_5*\bar{C}_4$ (64)

$H_3=\bar{C}_7*\bar{C}_6*C_5*C_4$ (65)

$H_4=\bar{C}_7*C_6*\bar{C}_5*\bar{C}_4$ (66)

$H_5=\bar{C}_7*C_6*\bar{C}_5*C_4$ (67)

$H_6=\bar{C}_7*C_6*C_5*\bar{C}_4$ (68)

$H_9=C_7*\bar{C}_6*\bar{C}_5*C_4$ (69)

$H_{10}=C_7*\bar{C}_6*C_5*\bar{C}_4$ (70)

$H_{11}=C_7*\bar{C}_6*C_5*C_4$ (71)

$H_{13}=C_7*C_6*\bar{C}_5*C_4$ (72)

$J_0=\bar{C}_3*\bar{C}_2*\bar{C}_1*\bar{C}_0$ (73)

$J_1=\bar{C}_3*\bar{C}_2*\bar{C}_1*C_0$ (74)

$J_8=C_3*\bar{C}_2*\bar{C}_1*\bar{C}_0$ (75)

If a received code sub-block C does not match any of the 1,024 valid code sub-blocks that can be derived from the data sub-blocks, it is desirable to set a flag to indicate that the code sub-block is an invalid code sub-block. A flag, $F_g$ can be set to "1" to indicate an invalid code block based on the following expression:

$F_g=(\overline{T_1*T_2*K*L*M*N*P*Q})$ (76)

Based on equations 50–75, expressions for determining the individual bits of data sub-block A are as follows:

$A_9=(C_9*T_1)+(C_9*T_2)+|((C_8*K)+(C_9*L)+(C_9*C_8*M)+N+(C_3*P)+Q)*T_3|$ (77)

$A_8=(C_8*T_1)+(C_8*T_2)+|((C_7*K)+(C_6*L)+(C_8*M)+N+(C_1*P)+Q)*T_3|$ (78)

$A_7=(C_7*T_1)+(\bar{C}_7*T_2)+|((C_3*K)+(C_1*C_0*L)+(C_9*\bar{C}_8*M)+((H_{10}+H_6)*N)+(C_0*P)+(C_2*Q))*T_3|$ (79)

$A_6=(\underline{C_6}*T_1)+(\bar{C}_6*T_2)+|((C_2*K)+(C_9*\bar{C}_8*M)+(C_6*N)+(C_0*P)+(C_1*Q))*T_3|$ (80)

$A_5=(C_5*T_1)+(\bar{C}_5*T_2)+|((C_1*K)+(C_8*M)+(C_0*P)+(C_0*Q))*T_3|$ (81)

$A_4=(\underline{C_4}*T_1)+(\bar{C}_4*T_2)+|((C_0*K)+(\bar{C}_0*L)+(C_8*M)+(C_7*C_4*N)+(C_0*P))*T_3|$ (82)

$A_3(C_3*T_1)+(C_3*T_2)+|((C_5*K)+(C_2*L)+(C_3*N))*T_3|$ (83)

$A_2=(C_2*T_1)+(C_2*T_2)+|((C_2*M)+(C_2*N))*T_3|(84)$ $A_1=(C_1*T_1)+(C_1*T_2)+|((C_1*M)+(C_1*N))*T_3|$ (85)

$A_0=(C_0*T_1)+(C_0*T_2)+|((C_0*M)+(C_0*N)+P+Q)*T_3|$ (86)

The present invention simplifies the implementation of an encoder and decoder for a rate 16/17 RLL code by using a rate 10/11RLL code and by using simple encoding logic to encode a majority of the data sub-blocks input to the 10/11encoder.

Although the present invention has been described with reference to preferred embodiments, workers skilled in the art will recognize that changes may be made in form and detail without departing from the spirit and scope of the invention.

What is claimed is:

1. An apparatus for encoding data blocks into code blocks, each data block containing a number of data symbols, and each code block containing a number of code symbols, the number of code symbols greater than the number of data symbols, the apparatus comprising:

a data block latch, for receiving individual data blocks and for dividing each data block into a first data sub-block and a second data sub-block;

an encoder, coupled to the data block latch, for receiving the first data sub-block and for encoding the first data sub-block into a first code sub-block; and an interleaver, coupled to the encoder and the data block latch, for combining data symbols in each second data sub-block with code symbols in each first code sub-block to produce each code block, the code blocks such that when concatenated with each other to produce a string of code symbols no more than five consecutive occurrences of a first code symbol are present in the string of code symbols.

2. The apparatus of claim 1 wherein the encoder encodes at least some of the first data sub-blocks by adding an inserted code symbol to the first data sub-blocks.

3. The apparatus of claim 2 wherein the inserted code symbol is added to an end of the first data sub-block.

4. The apparatus of claim 2 wherein a majority of the first data sub-blocks are encoded by adding an inserted code symbol into the first data sub-blocks.

5. The apparatus of claim 1 wherein the data symbols and the code symbols are from a set of binary symbols, the set of binary symbols having a first binary symbol and second binary symbol, the first and second binary symbols considered the inverse of each other, at least some of the first data sub-blocks encoded by inverting selected data symbols in each first data sub-block while not inverting the remaining data symbols in each first data sub-block, thereby producing mixed blocks, the first code sub-blocks completed by adding an inserted code symbol to each mixed block, the selected data symbols occurring in the same position in each first data sub-block encoded in this manner.

6. The apparatus of claim 5 wherein the first data sub-blocks encoded by adding an inserted code symbol into the first data sub-blocks and the first data sub-blocks encoded by inverting selected data symbols in each first data sub-block while not inverting the remaining data symbols in each first data sub-block thereby producing mixed blocks and adding an inserted code symbol to each mixed block, the selected data symbols occurring in the same position in each first data sub-block, together represent a majority of first data sub-blocks.

7. The apparatus of claim 1 wherein the number of data symbols is sixteen and the number of code symbols is seventeen.

8. The apparatus of claim 1 wherein the first data sub-block comprises ten data symbols, the first code sub-block comprises eleven code symbols represented by $C_{10}$ $C_9$ $C_8$ $C_7$ $C_6$ $C_5$ $C_4$ $C_3$ $C_2$ $C_1$ $C_0$, each second data sub-block comprises data symbols represented by $B_5$ $B_4$ $B_3$ $B_2$ $B_1$ $B_0$, and each code block comprises a combination represented by one sequence selected from a group of sequences consisting of:

$C_{10}$ $C_9$ $B_5$ $C_8$ $B_4$ $C_7$ $C_6$ $B_3$ $B_2$ $C_5$ $C_4$ $B_1$ $C_3$ $B_0$ $C_2$ $C_1$ $C_0$; and $C_{10}$ $C_9$ $C_8$ $B_5$ $C_7$ $B_4$ $C_6$ $C_5$ $B_3$ $B_2$ $C_4$ $C_3$ $B_1$ $C_2$ $B_0$ $C_1$ $C_0$.

9. An apparatus for decoding code blocks into data blocks, each data block containing a number of data symbols, and each code block containing a number of code symbols, the number of code symbols being greater than the number of data symbols, the apparatus comprising:

a code block latch, for receiving individual code blocks and for dividing each code block into a first code sub-block and a second code sub-block, the code blocks such that when concatenated with each other to produce a string of code symbols, no more than five consecutive occurrences of a first code symbol are present in the string of code symbols;

a decoder, coupled to the code block latch, for receiving the first code sub-block and for decoding the first code sub-block into a first data sub-block; and an interleaver, coupled to the decoder and the code block latch, for combining code symbols in each second code sub-block with data symbols in each first data sub-block to produce each data block.

10. The apparatus of claim 9 wherein a majority of the first code sub-blocks are decoded by removing a code symbol from the first code sub-blocks.

11. The apparatus of claim 9 wherein the data symbols and the code symbols are from a set of binary symbols, the set of binary symbols having a first binary symbol and second binary symbol, the first and second binary symbols considered the inverse of each other, at least some of the first code sub-blocks are decoded by inverting selected code symbols in each first code sub-block while not inverting the remaining code symbols in each first code sub-block, thereby producing mixed blocks, the first data-sub blocks completed by removing an inserted code symbol from each mixed block, the selected code symbols occurring in the same position in each first code sub-block decoded in this manner.

12. The apparatus of claim 11 wherein a majority of the first code sub-blocks are decoded either by removing a code symbol from the first code sub-blocks, or by inverting selected code symbols in each first code sub-block while not inverting the remaining code symbols in each first code sub-block thereby producing mixed blocks and removing a code symbol from each mixed block, the selected code symbols occurring in the same position in each first code sub-block.

13. The apparatus of claim 9 wherein the number of data symbols is sixteen, the number of code symbols is seventeen, each first code sub-block comprises code symbols represented by $C_{10}$ $C_9$ $C_8$ $C_7$ $C_6$ $C_5$ $C_4$ $C_3$ $C_2$ $C_1$ $C_0$, each second code sub-block comprises code symbols represented by $B_5$ $B_4$ $B_3$ $B_2$ $B_1$ $B_0$, and each code block comprises a combination represented by one sequence selected from a group of sequences consisting of:

$C_{10}$ $C_9$ $B_5$ $C_8$ $B_4$ $C_7$ $C_6$ $B_3$ $B_2$ $C_5$ $C_4$ $B_1$ $C_3$ $B_0$ $C_2$ $C_1$ $C_0$; and $C_{10}$ $C_9$ $C_8$ $B_5$ $C_7$ $B_4$ $C_6$ $C_5$ $B_3$ $B_2$ $C_4$ $C_3$ $B_1$ $C_2$ $B_0$ $C_1$ $C_0$.

14. A method for encoding data blocks into code blocks, each data block containing a number of data symbols, and each code block containing a number of code symbols, the number of code symbols greater than the number of data symbols, the method comprising:

dividing each data block into a first data sub-block and a second data sub-block;

encoding the first data sub-block into a first code sub-block; and interleaving the data symbols in each second data sub-block with code symbols in each first code sub-block to produce each code block, the code blocks such that when concatenated with each other to produce a string of code symbols no more than five consecutive occurrences of a first code symbol are present in the string of code symbols.

15. The method of claim 14 wherein a majority of the code sub-blocks are completely formed by adding a code symbol to an end of respective first data sub-blocks.

16. The method of claim 12 wherein the first data sub-blocks encoded by adding an inserted code symbol into the first data sub-blocks and the first data sub-blocks encoded by inverting selected data symbols in each first data sub-block while not inverting the remaining data symbols in each first data sub-block thereby producing mixed blocks and adding an inserted code symbol to each mixed block, the selected data symbols occurring in the same position in each first data sub-block, together represent a majority of first data sub-blocks.

17. The method of claim 14 wherein the number of data symbols is sixteen, the number of code symbols is seventeen, each first code sub-block comprises code symbols represented by $C_{10}$ $C_9$ $C_8$ $C_7$ $C_6$ $C_5$ $C_4$ $C_3$ $C_2$ $C_1$ $C_0$, each second data sub-block comprises data symbols represented by $B_5$ $B_4$ $B_3$ $B_2$ $B_1$ $B_0$, and each code block comprises a combination represented by one sequence selected from a group of sequences consisting of:

$C_{10}$ $C_9$ $B_5$ $C_8$ $B_4$ $C_7$ $C_6$ $B_3$ $B_2$ $C_5$ $C_4$ $B_1$ $C_3 B_0$ $C_2 C_1$ $C_0$; and $C_{10}$ $C_9$ $C_8$ $B_5$ $C_7$ $B_4$ $C_6$ $C_5$ $B_3$ $B_2$ $C_4$ $C_3$ $B_1$ $C_2$ $B_0$ $C_1$ $C_0$.

18. A method for decoding code blocks into data blocks, each data block containing a number of data symbols, and each code block containing a number of code symbols, the number of code symbols being greater than the number of data symbols, the method comprising:

dividing each code block into a first code sub-block and a second code sub-block, the code blocks such that when concatenated with each other to produce a string of code symbols, no more than five consecutive occurrences of a first code symbol are present in the string of code symbols;

decoding the first code sub-block into a first data sub-block; and combining code symbols in a second code sub-block with data symbols in a first data sub-block to produce a data block.

19. The method of claim 18 wherein a majority of the first code sub-blocks are completely decoded by removing a code symbol from the first code sub-blocks.

20. The method of claim 18 wherein the number of data symbols is sixteen, the number of code symbols is seventeen, each first code sub-block comprises code symbols represented by $C_{10}$ $C_9$ $C_8$ $C_7$ $C_6$ $C_5$ $C_4$ $C_3$ $C_2$ $C_1$ $C_0$, each second code sub-block comprises code symbols represented by $B_5$ $B_4$ $B_3$ $B_2$ $B_1$ $B_0$, and each code block comprises a combination represented by one sequence selected from a group of sequences consisting of:

$C_{10}$ $C_9$ $B_5$ $C_8$ $B_4$ $C_7$ $C_6$ $B_3$ $B_2$ $C_5$ $C_4$ $B_1$ $C_3$ $B_0$ $C_2$ $C_1$ $C_0$; and $C_{10}$ $C_9$ $C_8$ $B_5$ $C_7$ $B_4$ $C_6$ $C_5$ $B_3$ $B_2$ $C_4$ $C_3$ $B_1$ $C_2$ $B_0$ $C_1$ $C_0$.

* * * * *

UNITED STATES PATENT AND TRADEMARK OFFICE
CERTIFICATE OF CORRECTION

PATENT NO. : 5,781,133
DATED : JULY 14, 1998
INVENTOR(S) : KINGING PAUL TSANG

It is certified that error appears in the above-identified patent and that said Letters Patent is hereby corrected as shown below:

Col. 5, Equation (14) delete "$C_o+C_9+C_81$", and insert --$C_o+C_9+C_8=1$--

Col. 6, line 21, delete "$A_4+A_3A_2+A_1$", and insert --$A_4+A_3+A_2+A_1$--

Col. 7, values (27), delete $G_1=\bar{A}_9*\bar{A}_8$", and insert --$G_1=\bar{A}_9*A_8$--

Signed and Sealed this

Sixth Day of July, 1999

Attest:

Q. TODD DICKINSON

*Attesting Officer*  *Acting Commissioner of Patents and Trademarks*